(12) United States Patent  
Meinhold

(10) Patent No.: US 8,742,598 B2  
(45) Date of Patent: Jun. 3, 2014

(54) SEMICONDUCTOR STRUCTURE AND METHOD FOR MAKING SAME

(75) Inventor: Dirk Meinhold, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/253,112

(22) Filed: Oct. 5, 2011

(65) Prior Publication Data

US 2013/0087930 A1    Apr. 11, 2013

(51) Int. Cl.
*H01L 23/48* (2006.01)
*H01L 29/788* (2006.01)
*H01L 23/02* (2006.01)

(52) U.S. Cl.
USPC ............................ 257/782; 257/316; 257/686

(58) Field of Classification Search
USPC .......................................... 257/782, 316, 686
See application file for complete search history.

(56) References Cited

U.S. PATENT DOCUMENTS

| | | | |
|---|---|---|---|
| 5,425,647 A * | 6/1995 | Mencik et al. | 439/83 |
| 6,542,377 B1 * | 4/2003 | Fisher et al. | 361/777 |
| 2001/0027019 A1 * | 10/2001 | Ishii et al. | 438/690 |
| 2005/0077626 A1 * | 4/2005 | Seiller et al. | 257/748 |
| 2007/0018331 A1 * | 1/2007 | Chen | 257/774 |
| 2007/0090447 A1 * | 4/2007 | Morimoto et al. | 257/316 |
| 2007/0178694 A1 * | 8/2007 | Hiatt | 438/667 |
| 2008/0054444 A1 * | 3/2008 | Tuttle | 257/698 |
| 2009/0014859 A1 * | 1/2009 | Jeung et al. | 257/686 |
| 2009/0079080 A1 * | 3/2009 | Stecher | 257/762 |

* cited by examiner

*Primary Examiner* — Shaun Campbell
*Assistant Examiner* — Dzung Tran
(74) *Attorney, Agent, or Firm* — Philip Schlazer

(57) ABSTRACT

One or more embodiments relate to a semiconductor structure, comprising: a conductive pad, the conductive pad including a plurality of laterally spaced apart gaps diposed at least partially through the conductive pad.

25 Claims, 14 Drawing Sheets

SEMICONDUCTOR STRUCTURE AND METHOD FOR MAKING SAME

BACKGROUND

One or more embodiments of the present invention relate to semiconductor structures and methods for making semiconductor structures.

BRIEF DESCRIPTION. OF THE DRAWINGS

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as soma embodiments can be combined with one or more other embodiments to form new embodiments.

Figure 1:
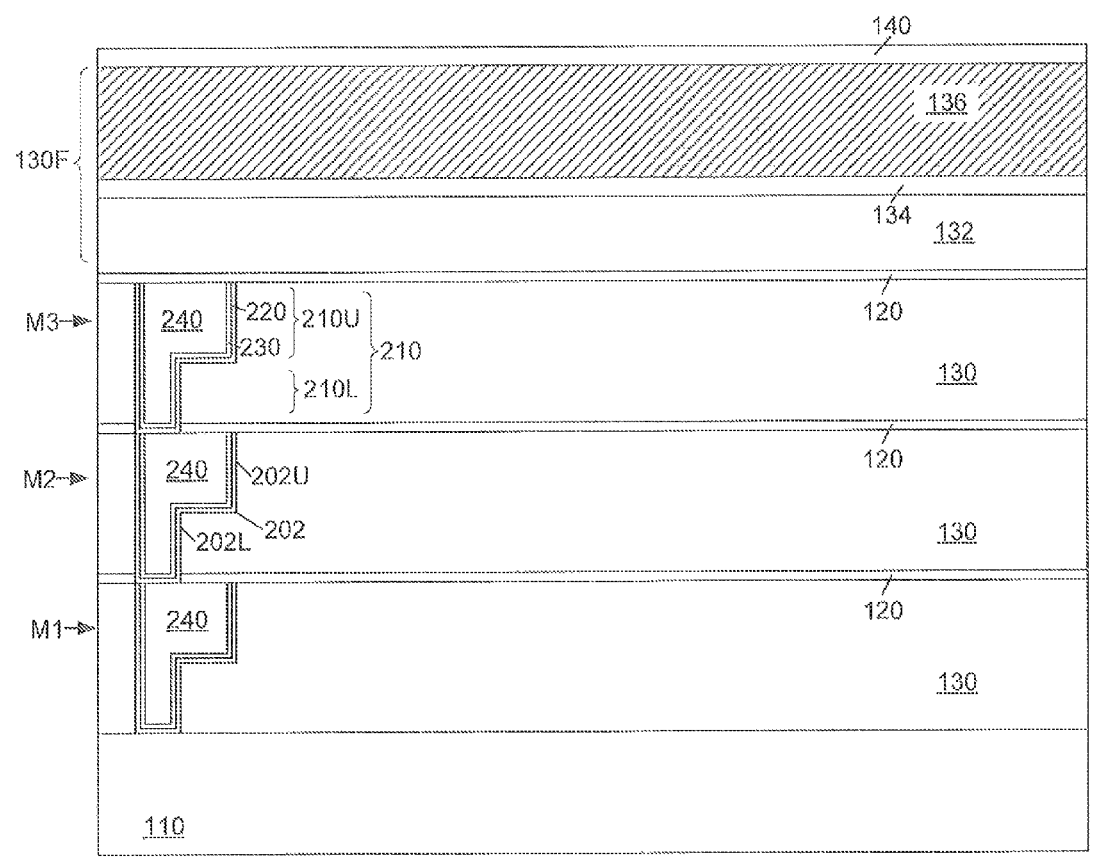
FIGS. 1 through 16B show a process for making a semiconductor structure in accordance with an embodiment.

FIG. 1 shows a semiconductor structure. The semiconductor structure may include a substrate 110. The substrate 110 may be a semiconductor substrate. The semiconductor substrate may a silicon substrate. The semiconductor substrate may be a bulk semiconductor substrate or an SOI substrate. The bulk semiconductor substrate may include an epitaxial layer or may be formed without an epitaxial layer.

The semiconductor structure may include one or more interlevel dielectric layers 130. The dielectric layer 130 may include an oxide, a nitride or an oxynitride. Alternately, the dielectric layer 130 may comprise a phosphosilicate glass (PSG), a borophosphosilicate glass (BPSG), a polyimide, a low-k dielectric.

A dual-tier (for example, dual inlaid) opening may be formed through an interlevel dielectric layer 130. The dual-tier opening 202 includes an upper conductive line portion 202U and a lower conductive via portion 202L. Conductive line portion 202U may be an opening such as a trench (but may also be a hole). Conductive via portion 202L may be an opening such as a hole (but may also be a trench).

A conductive feature 210 may be formed in the dual-tier opening 202. The conductive feature 210 may be formed by a dual-damascene process. The conductive feature 210 includes an upper conductive line portion 210U as well as a lower conductive via portion 210L. Each conductive feature 210 may include a fill layer 240 and may further include a seed layer 230 and a barrier layer 220.

The barrier layer 220 may comprise a conductive material. The barrier layer 220 may comprise, for example a metallic material. The barrier layer 220 may comprise Examples of material which may be used for the barrier layer 220 include tantalum nitride, titanium nitride, tantalum silicon nitride, tantalum, titanium tungsten or the like.

The seed layer 230 may comprise a conductive material. The seed layer 230 may comprise a metallic material. The seed layer 230 may, for example, comprise a pure metal or an alloy. It is understood that any pure metal may include some amount of trace impurities. An alloy may include at least two metallic elements. An alloy may include a metallic element and a non-metallic element. The seed layer 230 may comprise one or more of the elements Cu (copper), Al (aluminum), Au (gold), Ag (silver), and W (tungsten). Examples of materials include pure copper, copper alloy, pure aluminum, aluminum alloy, pure gold, gold alloy, pure silver, silver alloy, pure tungsten and tungsten alloy. The seed layer 230 may be formed by a physical vapor deposition or sputtering process.

The fill layer 240 may comprise a conductive material. The fill layer 240 may comprise a metallic material. The fill layer 240 may comprise a pure metal or an alloy. The fill layer 240 may comprise one or more of the elements Cu (copper), Al (aluminum), Au (gold), Ag (silver), and W (tungsten). Examples of materials include pure copper, copper alloy, pure aluminum, aluminum alloy, pure gold, gold alloy, pure silver, silver alloy, pure tungsten and tungsten alloy. The fill layer 240 may be formed by an electroplating (or electrodeposition) process.

As noted, each conductive feature 210 includes a conductive line 210U and a conductive via 210L. The conductive line 210U may be formed in an upper opening 202U which may be a trench while the conductive via may be formed in a lower opening 202L which may be a hole. The upper opening 202U and the lower opening 202L may be two portions of a two-tier (for example, a dual-inlaid) opening 202U, 202L. The composite opening 202U, 202L may be formed using at least two masking steps.

In some embodiments, a conductive line 210U may be useful for conducting electrical current in a horizontal direction. In some embodiments, a conductive via 210L may be useful for transmitting electric signals primarily in a vertical direction. A conductive via 210L may electrical couple a conductive line in one metallization level to a conductive line in another metallization level. A conductive via 210L may electrical couple a conductive line in one metallization level to the substrate 110.

A conductive line may be a conductive pad or may include a conductive pad. A conductive pad may be useful for the transmission or reception of electrical signals. In some embodiments, the conductive feature 210 may be formed by a dual-damascene process. The conductive line 210U and the conductive via 210L may, for example, be formed at the same time.

Each conductive line 210U may be part of a metallization level of the semiconductor structure. The metallization levels M1, M2 and M3 and shown in FIG. 1. A conductive structure may include a final metallization level MF. Each of the metallization levels may include one or more conductive lines. In some embodiments, each conductive line may be spaced apart from another conductive line. In some embodiments, one conductive line may be electrically isolated from another conductive line. A conductive line may include (or may be) a conductive pad. More generally, there may be at least one metallization level. In an embodiment, there may be a plurality of metallization levels. Referring to FIG. 1, it is seen how the conductive vias couple one metallization level (e.g. M1, M2, M3) to another metallization level.

A passivation layer 120 may formed over the interlevel dielectric layer 130 as well as the conductive feature 210. The passivation layer 120 may comprise a nitride (such as silicon nitride or boron nitride) or an oxynitride. The passivation layer 120 may be used to reduce the likelihood of metal atoms, within the interconnect 210 from diffusing into dielectric films that are subsequently deposited over the conductive line 210U. For example, if the conductive line 210U comprises the element Cu (copper), then passivation layer 120 serve may serve as a copper diffusion barrier.

The structure shown in FIG. 1 includes a final interlevel dielectric layer 130F. In the embodiment shown, the final interlevel dielectric layer 130F includes a dielectric layer 132 which overlies the barrier layer 120, a dielectric layer 134 which overlies the dielectric layer 132 and a dielectric layer 136 which overlies the dielectric layer 134.

Dielectric layer 132 may comprise an oxide, a nitride or an oxynitride. Alternatively, dielectric film 132 may comprise PSG, BPSG, SOG, a low-k dielectric or some other dielectric.

Dielectric layer 134 may be an etch stop layer. The dielectric layer 134 may comprise an oxide, a nitride (such as a silicon nitride or a boron nitride) or an oxynitride such as a silicon oxynitride.

Dielectric layer 136 may comprise an oxide, a nitride or an oxynitride. Alternatively, dielectric film 136 may comprise PSG, BPSG, SOG, a low-k dielectric or some other dielectric.

Figure 2:
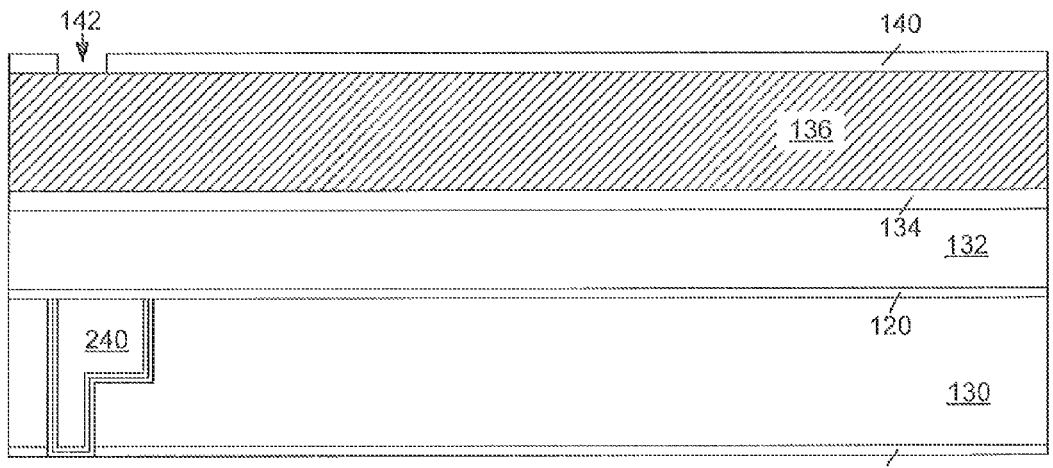

Referring to FIG. 2, a masking layer 140 is formed over the final interlevel dielectric layer 130F. The masking layer 140 may, for example, include a resist layer (e.g. a photoresist layer). An opening 142 is formed through the masking layer 140 to expose the dielectric layer 136.

Figure 3:
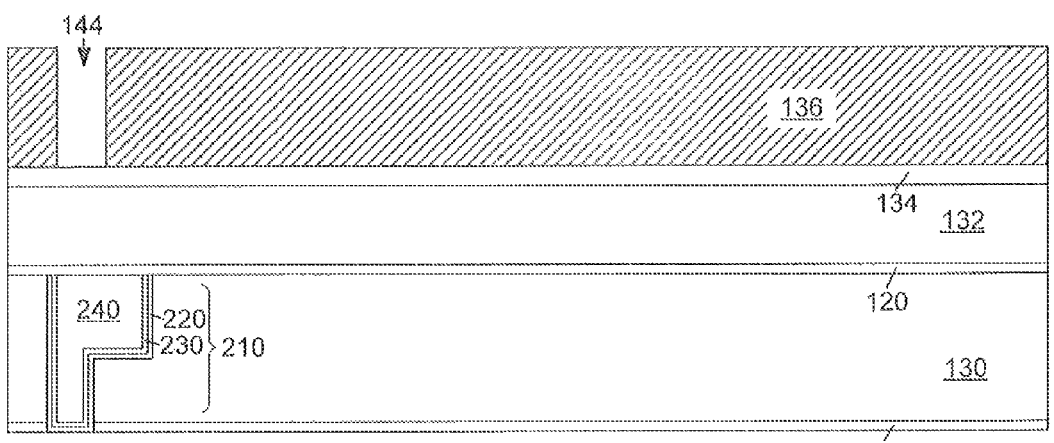

Referring to FIG. 3, an opening 144 is formed through the dielectric layer 136. The opening 144 stops on the dielectric layer 124 (e.g. etch stop layer).

Figure 4:
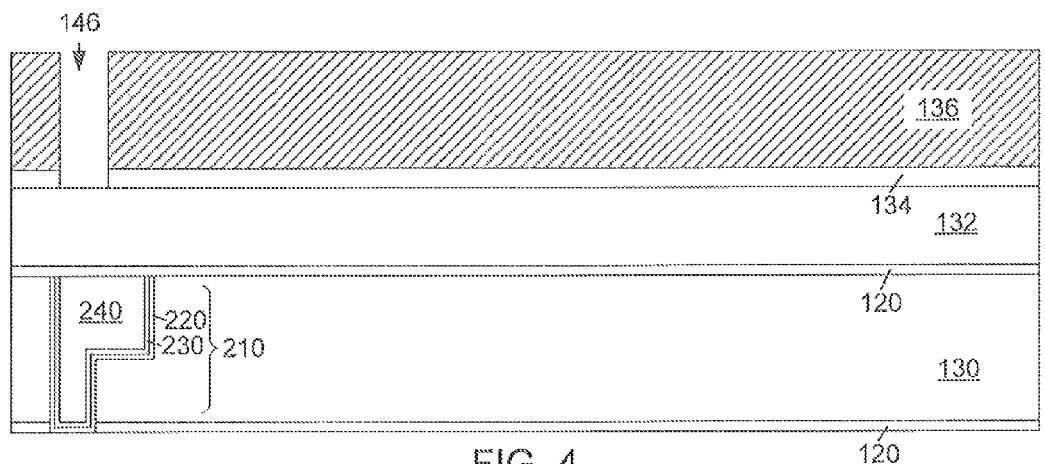

Referring to FIG. 4, and opening 146 is then formed through the dielectric layer 134.

Figure 5:
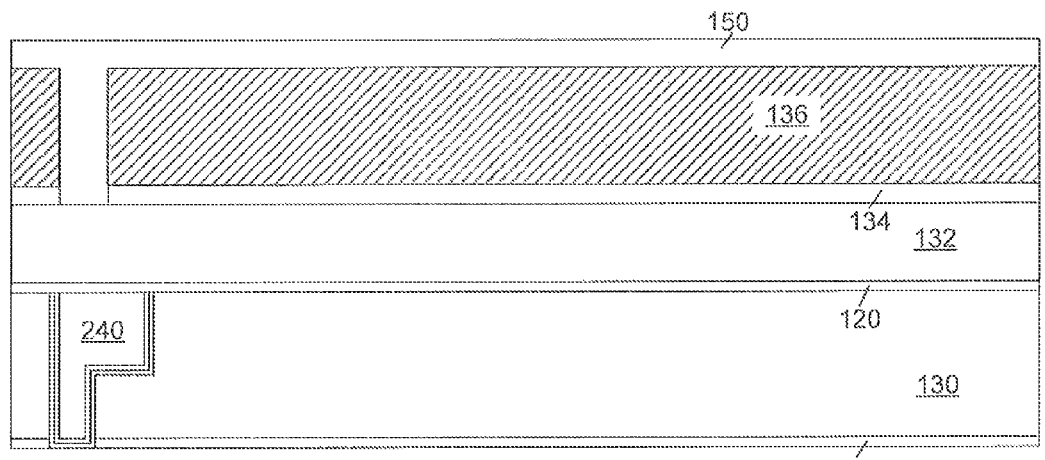

Referring to FIG. 5, the opening 146 is filled with a masking layer 150. The masking layer 150 may also overlie a top surface of the dielectric layer 136. The masking layer 150 may, for example, include a resist layer (e.g. a photoresist layer).

Figure 6:
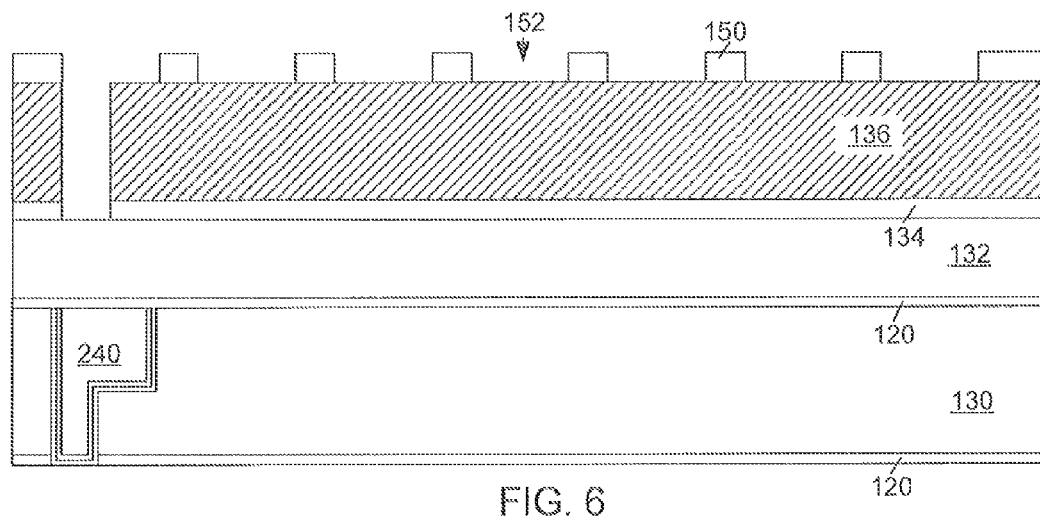

Referring to FIG. 6, the masking layer 150 is patterned. One or more openings 152 may be formed in the masking layer 150. The openings 152 may, for example, be trenches or holes. The openings 152 may, for example, for a grid pattern.

Figure 7:
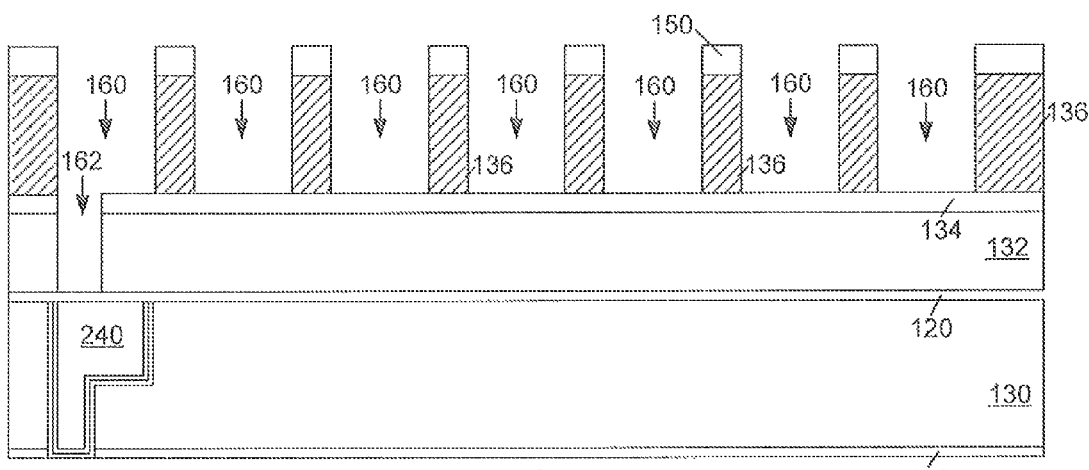

Referring to FIG. 7, the patterned masking layer 150 may be used as a mask in combination with an etch process (e.g. dry etch process) to etch the dielectric layer 136. The dielectric layer 136 may be etched to the dielectric layer 134 (e.g. the etch stop layer). The etching of the dielectric layer 136 forms a plurality of laterally spaced apart dielectric regions 136.

The laterally spaced apart dielectric regions 136 define at least one opening 160. The opening 160 may be in the form of a grid or screen. The dielectric layer 132 may also be etched to form the opening 162. The opening 162 may be formed using the same etch process as used to form the opening 160 or the opening 162 may be formed using a different etch process. The opening 162 is formed through the dielectric layer 132 and may stop on the barrier layer 120 (which may be a silicon nitride). The opening 162 may be in the form of a hole.

Figure 8:
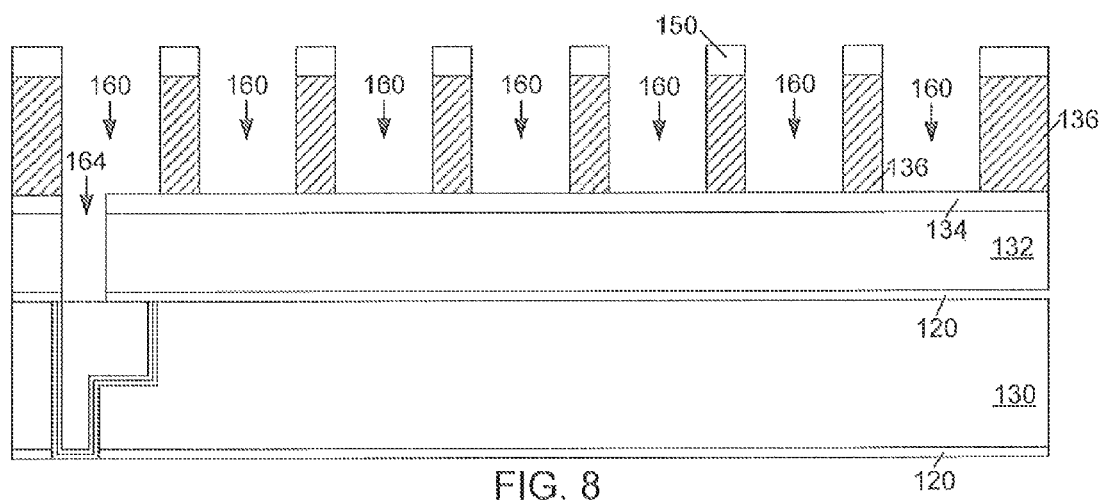
Figure 9:
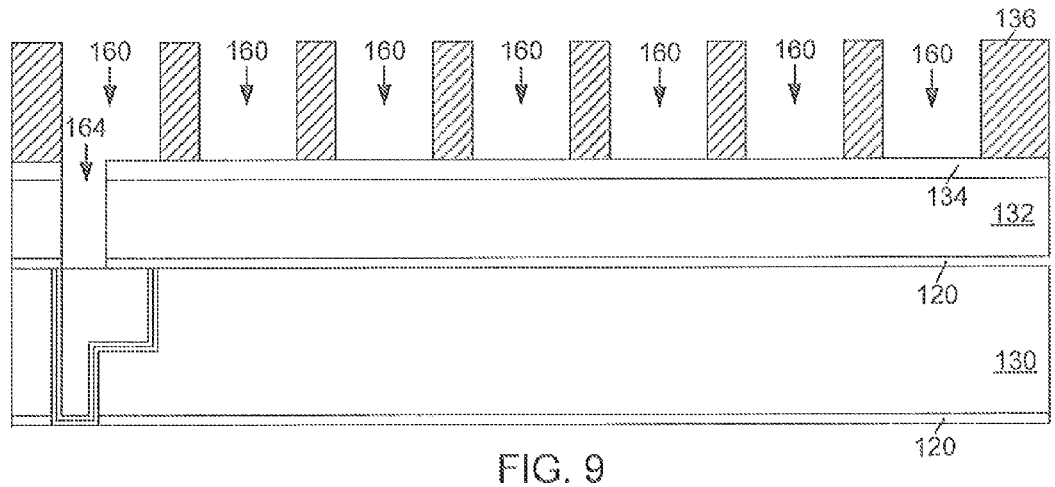

Referring to FIG. 8, an additional etch may be used to break through the barrier layer 120 so as to form the opening 164 and expose the top surface of the conductive feature 210. It is noted that the opening 160,164 defines a dual-tier opening with an upper portion 160 and a lower portion 164. The upper portion 160 may be in the form of a trench or a grid which may be useful for the formation of a conductive line opening useful for the formation of a conductive line. As explained in more detail below, a conductive line may include a conductive pad or may itself be a conductive pad. The lower portion 164 of the opening 160,164 may be in the form of a hole useful for the formation of a conductive via. Referring to FIG. 9, after the breakthrough through the barrier layer 120, the masking layer 150 may be removed.

Figure 10:
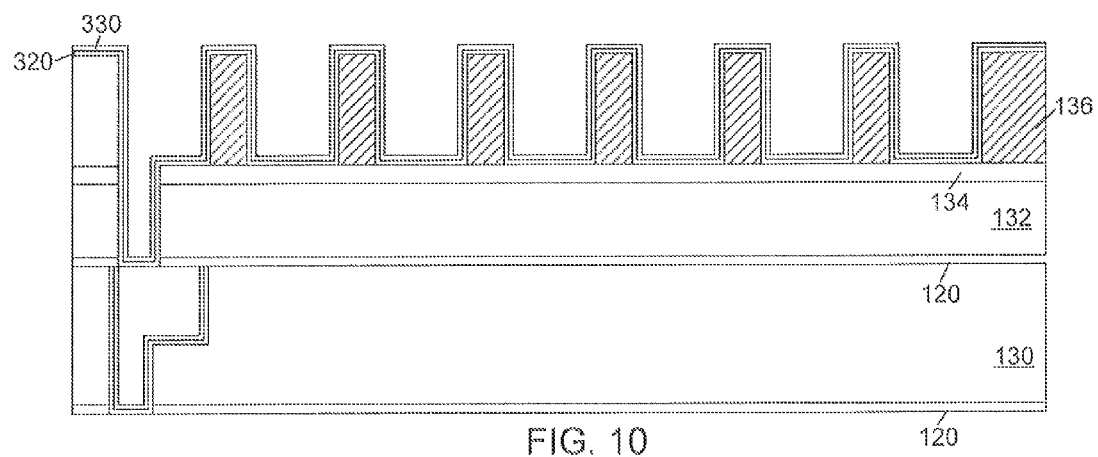

Referring to FIG. 10, a barrier layer 320 may be formed over the structure shown in FIG. 9 to form the structure shown in FIG. 10. The barrier layer 320 may be formed on the bottom and sidewall surfaces of opening 160,164. A seed layer 330 may then be formed over the barrier layer 320.

Figure 11:
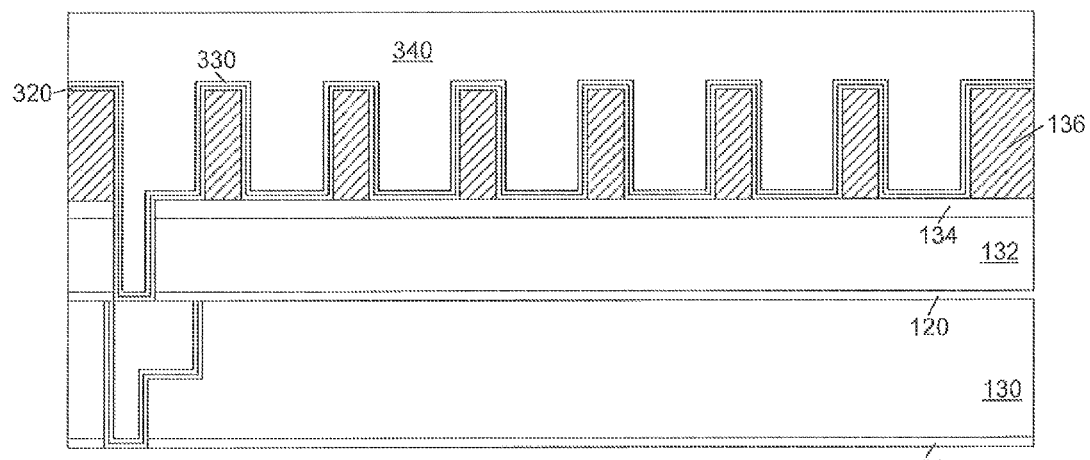

Referring FIG. 11, a fill layer 340 may be formed over the seed layer 330. The barrier layer 320, the seed layer 330 and the fill layer 340 may comprise the same materials as described above for the barrier layer 220, seed layer 230 and fill layer 240.

Figure 12:
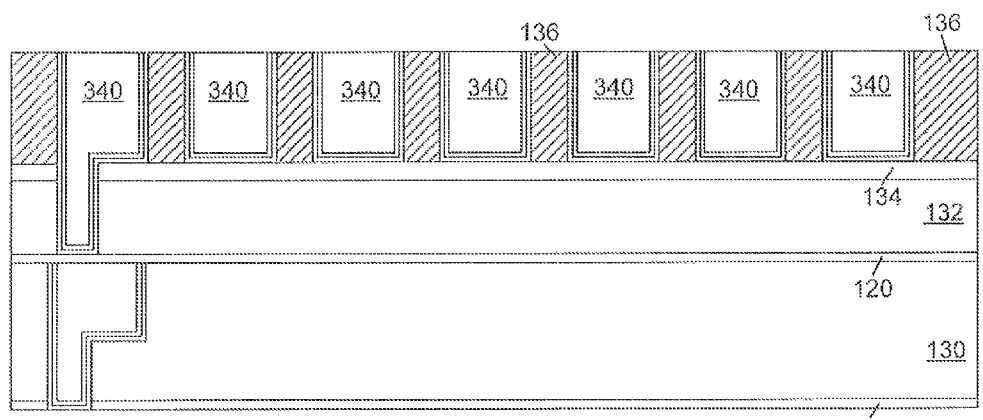

Referring to FIG. 12, the structure shown in FIG. 11 may then planarized. The planarization process may be a chemically mechanically polishing process (CMP). The CMP removes a top portion of the fill layer 340 as well as a top portion of the seed layer 330 and a top portion of the barrier layer 320. The CMP process may expose top surfaces of the dielectric regions 136.

Figure 13A:
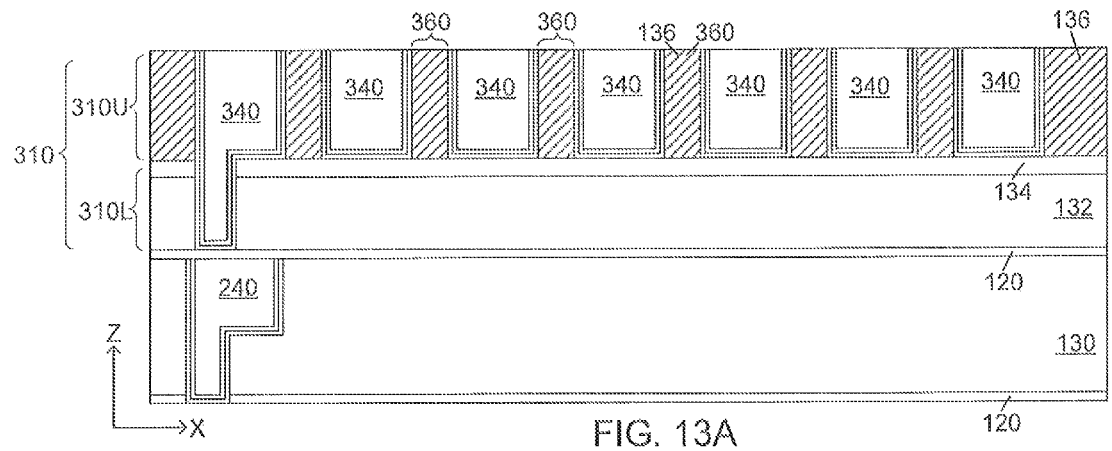
Figure 13B:
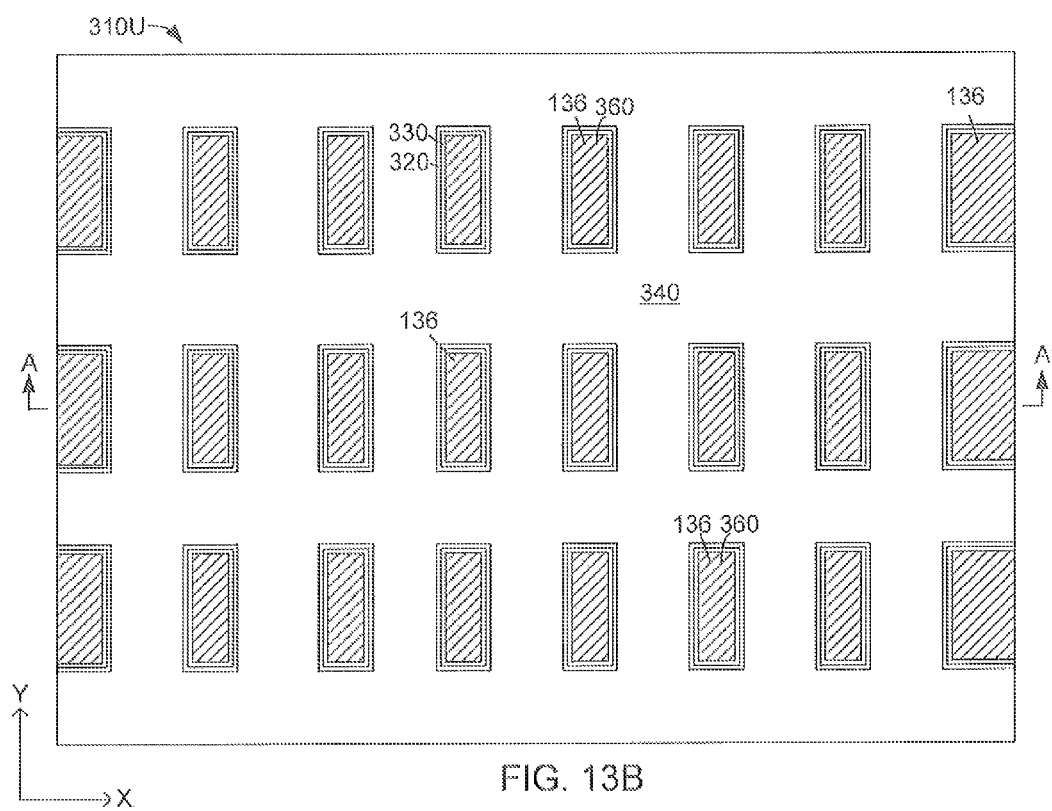

FIG. 13A repeats FIG. 12. FIG. 13B is a top view of FIG. 13A. FIG. 13A is a cross-sectional view of FIG. 13B through the cross-section AA'. From FIG. 13B, it is seen that the fill layer 340 may form a grid pattern that corresponds to the opening 160.

FIGS. 13A,B show a conductive feature 310. The conductive feature 310 includes an upper portion 310U and a lower portion 310L. The upper portion 310U is a conductive line 310U. The lower portion 310L is a conductive via. The upper portion 310U is a conductive line which may be part of a final metallization level MF of the semiconductor structure or device. The final metallization level MF may include one or more conductive lines. The final metallization level MF may include a plurality of conductive lines. The conductive lines may be spaced apart from each other. As noted, a conductive line 310U may be include a conductive pad or may be a conductive pad. In some embodiments, a conductive pad may be useful so that a semiconductor device or chip may send and receive electrical signals to and form location outside the device or chip.

Referring to FIGS. 13A,B, the conductive line 310U may be viewed as including one or more laterally spaced apart gaps 360. In the embodiment shown, the gaps 360 include the dielectric regions 136. As seen from FIGS. 13A,B, in the embodiment shown, the gaps 360 are the same as the dielectric region 136. In the embodiment shown, the conductive line 310U includes a plurality of laterally spaced apart gaps 360. The gaps 360 may be have an arrangement (e.g. a two-dimensional arrangement) that follows the arrangement of the dielectric regions 136. In the embodiment shown in FIG. 13A,B, the gaps 360 may be arranged in a two-dimensional array. The gaps 360 may be laterally spaced in a first dimension (e.g. in the X-dimension) and a second dimension (e.g. Y-dimension). The gaps may be arranged in rows and columns. The gaps may be staggered in the rows and staggered in the columns.

In another embodiment, the gaps 360 may be spaced apart in only a single dimension. In the embodiment shown, the gaps 360 may be formed all the way through the conductive line 310U. However, in another embodiment, the gaps 360 may be formed only partially through the conductive line 310U. Hence, gaps 360 may be formed at least partially through the conductive line 310U. In the embodiment shown, the lateral cross-sections of the gaps 360 as well as the lateral cross-sections of the dielectric regions 136 are each in the form of rectangles. However, in other embodiments, the lateral cross-sections may take other forms such as squares, circles, crosses etc. In one or more embodiments, the gaps 360 may be disposed at least partially through the conductive line 310U. In one or more embodiments, the gaps 360 may be disposed substantially fully (or fully) through the conductive line 310U.

Figure 18A:
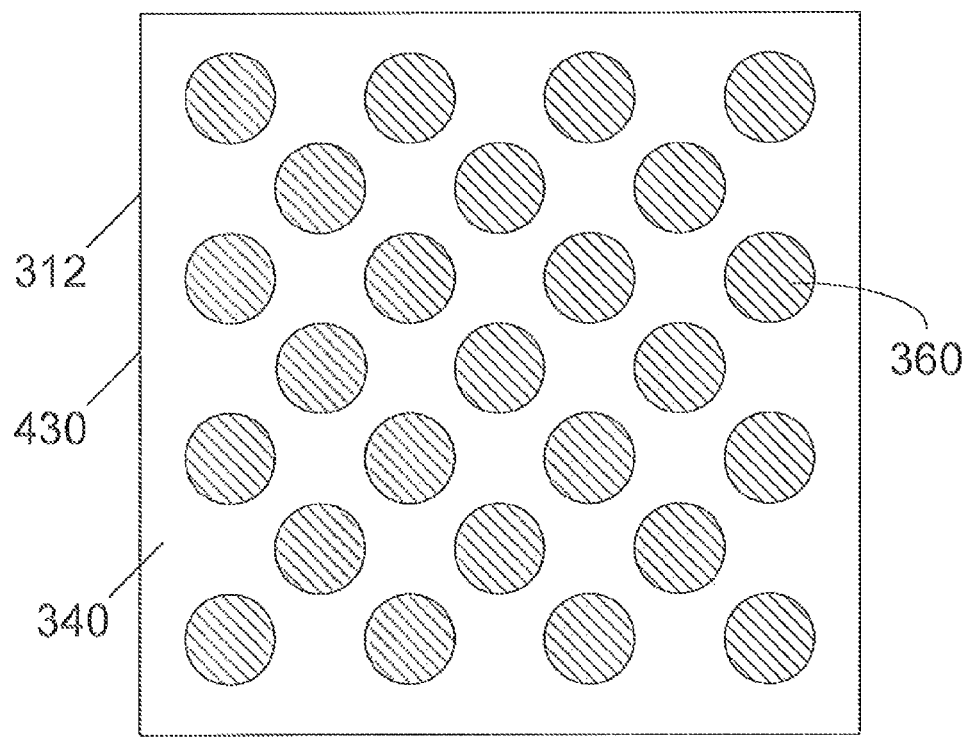
FIG. 18A shows a semiconductor structure in accordance with an embodiment.

Referring to FIG. 13B, in one or more embodiments, the gaps 360 may be disposed in a first direction and a second direction. In one or more embodiments, the first direction may be substantially perpendicular (or perpendicular) to each other. In one or more embodiments, the gaps may be staggered in the first direction and/or staggered in the second direction. In one or more embodiments, the gaps may be arranged in rows and columns. Embodiments of gaps and gap arrangements are shown in FIGS. 18A,B,C,D and discussed below.

Figure 14:
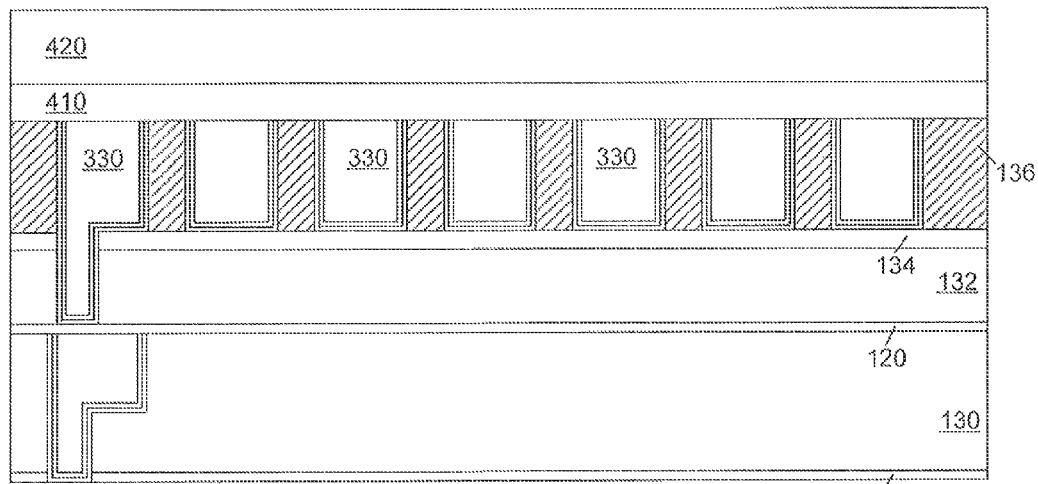

Referring to FIG. 14, a dielectric layer 410 may be formed over the structure from FIGS. 13A,B and a dielectric layer 420 may be formed over the dielectric layer 410. The dielectric layer 410 may comprise an oxide, a nitride or an oxynitride. The dielectric layer 420 may comprise an oxide, a nitride or an oxynitride. The dielectric layer 410 may be different from the dielectric layer 420. For example, the dielectric layer 410 and the dielectric layer 420 may comprise one or more different dielectric materials.

Figure 15:
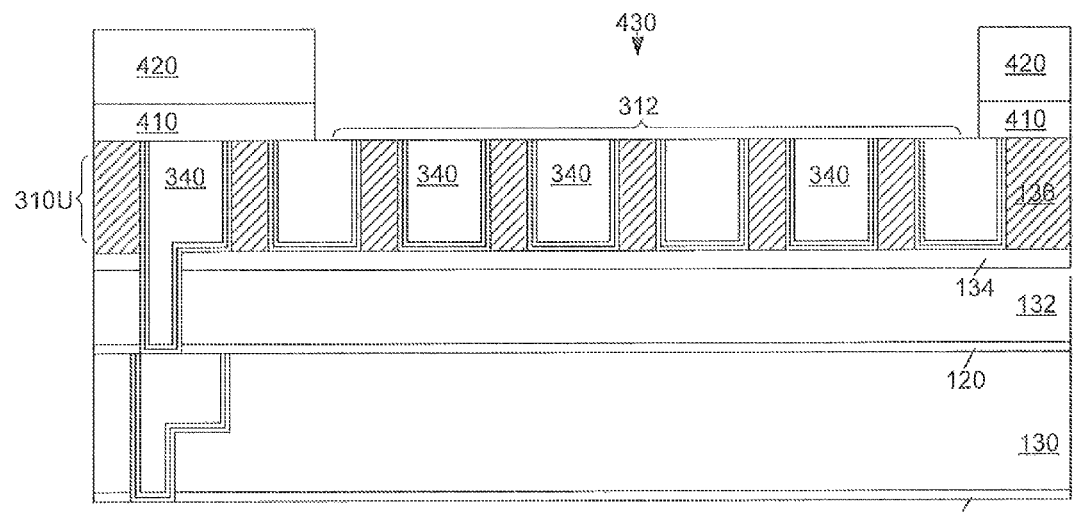

Referring to FIG. 15, an opening 430 is formed through the dielectric layers 410,420 and may expose at least a portion 312 of a top surface of the conductive line 310U so that at least a portion of the conductive line 310U may function as a conductive pad (which may also be referred to as a bonding pad, a contact pad or as a pad). Hence, at least a portion of conductive line 310U may be a conductive pad. As noted above, a conductive pad may, for example, be useful for the transmission of electrical signals to and from a semiconductor device. Likewise, a conductive pad may be useful for probing and testing of a semiconductor device. The top surface 312 may be referred to as the effective pad area. It is understood that a conductive line 310U (and hence, the conductive pad) may have any lateral cross-sectional shape. Likewise, the effective pad area 312 may have any lateral shape. The conductive line 310U shown in FIG. 16A may be referred to as conductive pad 310U.

Figure 16A:
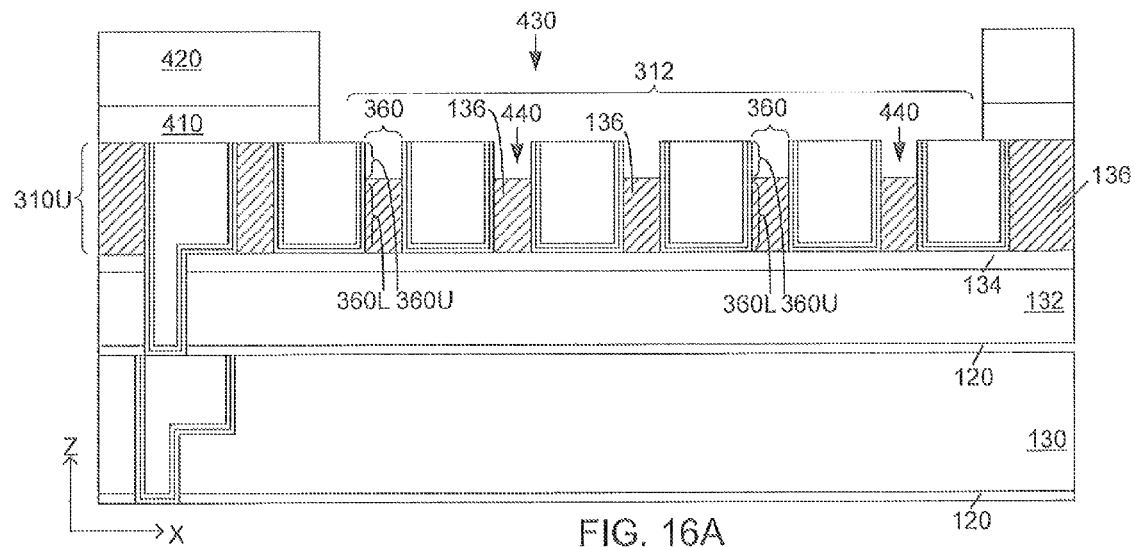

Referring to FIG. 16A, at least a portion of each of the dielectric regions 136 within each of the gaps 360 may be removed. In the embodiment shown, only a portion of each of the dielectric regions 136 may be removed so as to form cavities 440. In another embodiment, all of each of the dielectric regions 136 within a corresponding gap 360 may be removed so that the cavities 440 go all the way through the conductive pad 310U. The removal may be accomplished using an etching process. In one more embodiments, the etching process may include a dry etching process. In one or more embodiments, the etching process may include a wet etching process.

In an embodiment, the cavities 440 may be filled with some cavity-filling material. The cavity-filling material may be a material may be another dielectric material which is different from the dielectric material 136. The cavity-filling material may be a material which is less stiff (or less rigid) than the fill material 340. The cavity-filling material may be less stiff than the dielectric material 136.

Figure 16B:
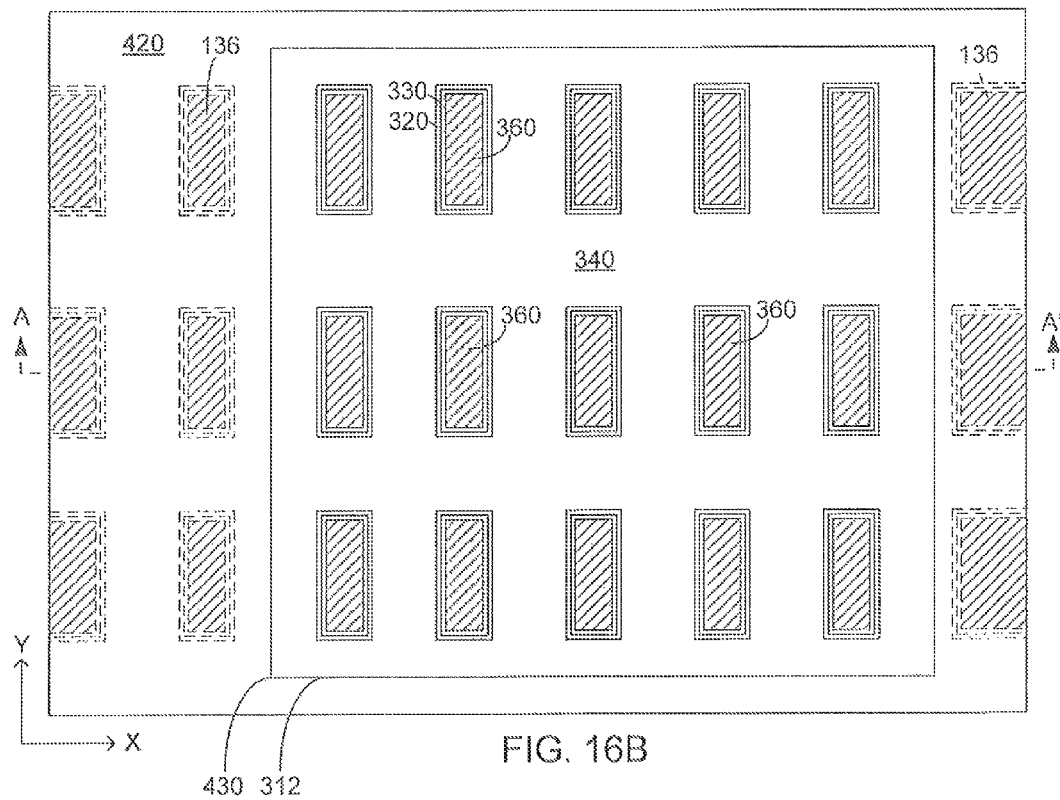

FIG. 16B shows a top view of FIG. 16A. Likewise, FIG. 16A represents a cross-sectional view of FIG. 16B through the cross-section AA'. FIG. 16B shows the openings 430 as well as the effective pad area 312.

Hence, FIGS. 16A,B shows a conductive pad 310U that includes a plurality of spaced apart gaps 360. In the embodiment shown, the lateral cross-section of the gaps 360 may be rectangular. However, in other embodiments, the lateral cross-sections may have any other shape such as, for example, square, circular, oval, triangular, cross-shaped, etc. In an embodiment, at least a lower portion 360L of one or more (or each) of the gaps 360 may be filled with a dielectric material 136. In one or more embodiments, the dielectric material 136 may substantially fill (or fill) one or more (or each) of the gaps 360.

In an embodiment, an upper portion 360U of one or more (or each) of the gaps may be a cavity 440. In one or more embodiments, the cavity 440 pay substantially fill (or fill) one or more of (or each of) the gaps 360. In another embodiment, the cavities 440 may be filled with a cavity-filling material. The cavity-filling material may be a gas such as air (or some other gas). The cavity-filling material may be a liquid. The cavity-filling material may be a solid such as another dielectric material different from the dielectric material 136. As an example, the cavity-filling material may be a material which is less stiff than the material of layer 340. In one or more embodiments, the upper portion 360U may be filled with the cavity-filling material.

In another embodiment, all of the dielectric material 136 of each of the gaps 360 may be removed so that the cavities 440 go all the way through the conductive pad 310U. In another embodiment, it is possible that no cavities are formed. It is possible that the dielectric material 136 fills each of the gaps 360.

The conductive pad 3100 is electrically coupled to a conductive via 310L. The conductive via 310L electrically coupled the conductive pad 310U to the next lower metallization level. In one or more embodiments, the conductive pad 310U and the conductive via 310L may be a dual damascene structure. In one or more embodiments, it is possible that the conductive pad is formed as a single damascene structure.

Referring again to FIG. 16A, it is seen that a portion 360L of gap 360 may include a dielectric 136 while a portion 360U of gap 360 may be a cavity 440. In one or more embodiments, the dielectric 136 may form at least about 50 percent of gap 360. In one or more embodiments, the dielectric 136 may form at least about 60 percent of gap 360. In one or more embodiments, the dielectric 136 may formed at least about 70 percent of gap 360. In one or more embodiments, the dielectric 136 may formed at least about 80 percent of gap 360. In one or more embodiments, the dielectric 136 may formed at least about 90 percent of gap 360. In one or more embodiments, the dielectric 136 may formed at least about 50 percent of the gap 360 but less then or equal to about 90 percent of the gap 360.

In one or more embodiments, the cavity 440 may form at least about 10 percent of the gap 360. In one or more embodiments, the cavity 440 may form at least about 20 percent of the gap 360. In one or more embodiments, the cavity 440 may form at least about 30 percent of the gap 360. In one or more embodiments, the cavity 440 may form at least about 40 percent of the gap 360. In one or more embodiments, the cavity 440 may form at least about 50 percent of the gap 360.

In one or more embodiments, the cavity 440 may form at least about 10 percent of the gap 360 but less than or equal to about 50 percent of the gap 360.

Figure 17A:
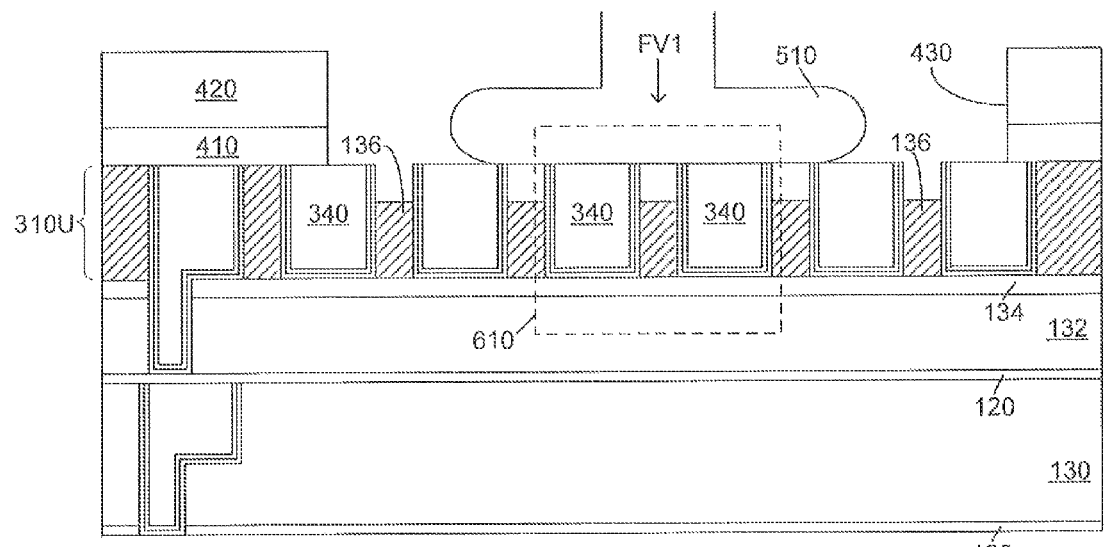
FIG. 17A shows a semiconductor structure in accordance with an embodiment.
Figure 17B:
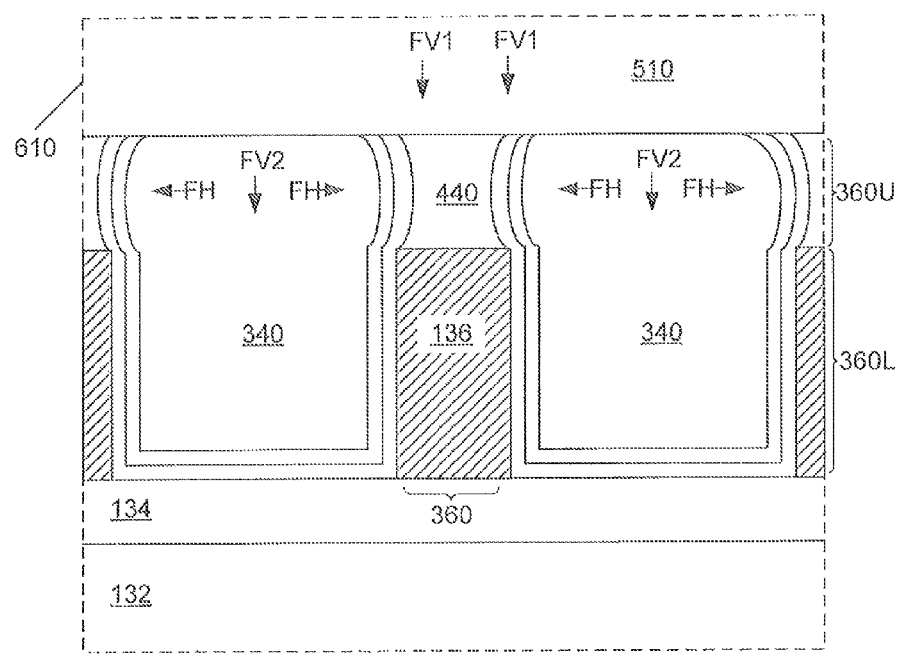
FIG. 17B shows larger view of a portion of FIG. 17A.

Referring to FIGS. 17A and 17B, a wire bond 510 may be placed on top of the conductive pad 310U. In one or more embodiments, the wire bond 510 may be placed over the effective bond region 312. The wire bond 510 applies a downward and vertical force FV1 to the conductive pad 310U. The force FV1 may be applied, for example, somewhere over the effective bond region 312. Because the dielectric material 136 has been removed from the upper portion 360U of the gaps 360 so as to form cavities 440, the fill material 340 of the conductive pad 310U can displace in a lateral direction (as shown) toward the cavities 440. This can be seen in FIG. 17B which shows a more detailed view of section 610 of FIG. 17A.

The ability for the fill material 340 to displace laterally may allow the conductive pad 310U to absorb some of the force FV1 applied by the wire, bond 510. Hence, the downward force FV2 within the fill material 340 shown in FIG. 17B may be less than the initial downward force FV1 applied to the top surfaces of the fill material 340. This may allow for a greater force FV1 to be applied to the conductive pad 310U without damaging either the pad itself or the material underlying the pad. This may permit the placement of devices (e.g. electronic device such as active or passive devices) under the conductive pad. Use may also be made under the pad for functional conductive lines (in one or more of the metallization levels or for devices).

Figure 18B:
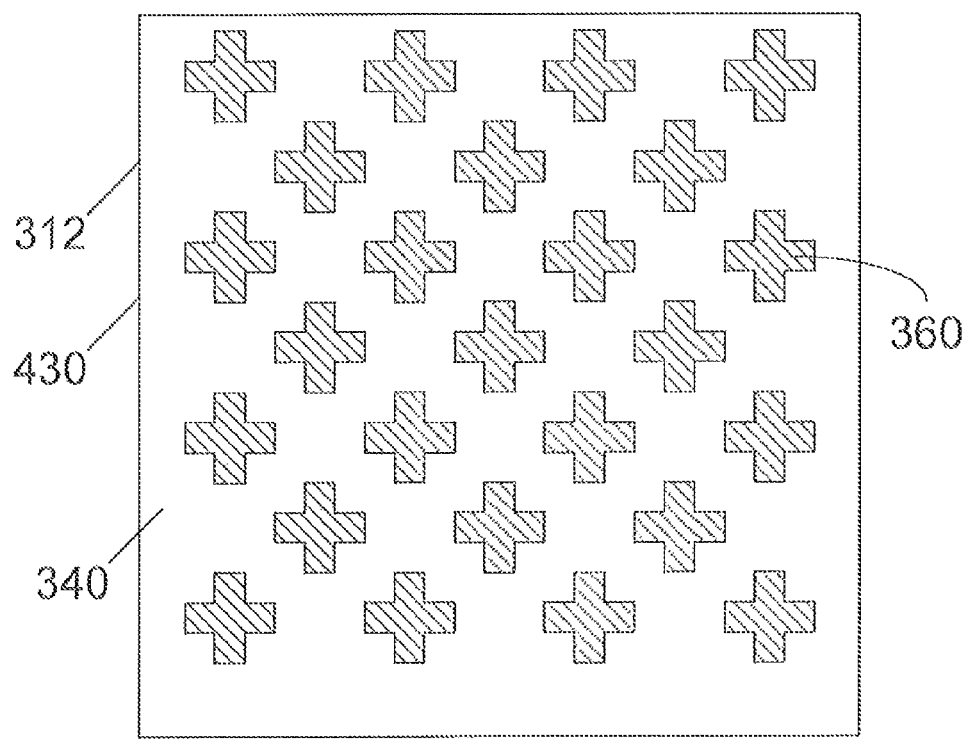
FIG. 18B shows a semiconductor structure in accordance with an embodiment.
Figure 18C:
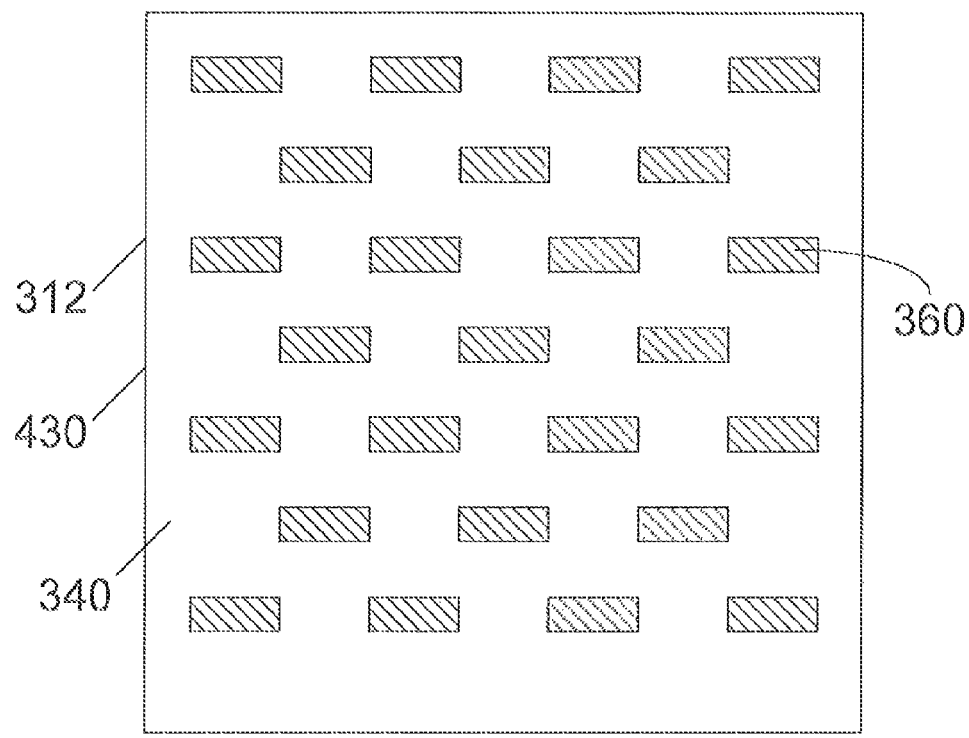
FIG. 18C shows a semiconductor structure in accordance with an embodiment.
Figure 18D:
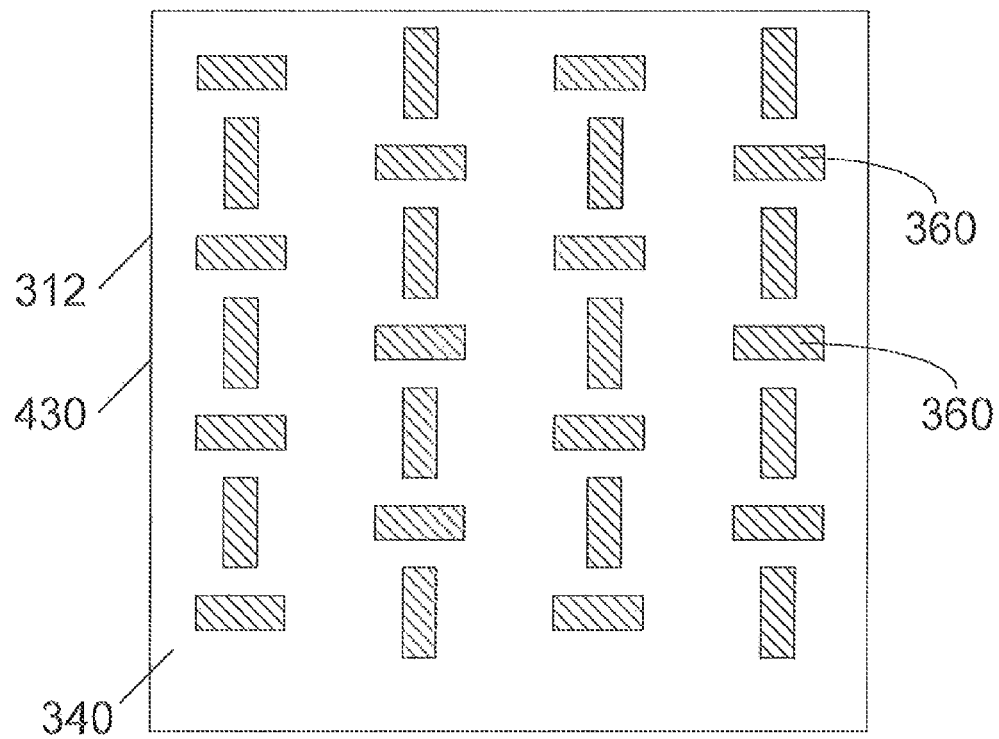
FIG. 18D shows a semiconductor structure in accordance with an embodiment.

As noted above, the gaps 360 (shown, for example in FIGS. 16A and 16B) may have any lateral cross-sectional shape. FIGS. 18A,B,C,D provides embodiments of top views of effective pad areas 312 formed within an opening 430 (as shown in FIGS. 16A and 16B). Each of the FIGS. 18A,B,C,D shows the effective pad area 312 that includes the gaps 360. The effective pad area 312 further includes the fill material 340 and may further include seed layer material and barrier layer material (not shown). A noted above, a dielectric material may at least partially fill the gaps 360. Likewise, in other embodiments, the gaps 360 may not include the dielectric material. Referring to FIGS. 18A,B,C,D it is seen that may different shapes for the lateral cross-sections of the gaps 360 are possible. FIG. 18A shows that the gaps 360 may be formed as a circle. FIG. 18B shows that the gaps 360 may be formed as a cross. FIG. 18C shows that the gaps 360 may be formed as a rectangle (or as a square). FIG. 18D shows that the gaps 360 may be formed as rectangles with the length of the rectangles of alternating openings 360 oriented in different directions. While FIGS. 18A,B,C,D do not show the layers 320 and 330 that are shown in FIG. 16A,B but it understood that, in one or more embodiments, they may additionally be present.

Referring again to FIG. 18A,B,C,D, in one or more embodiments, it is possible that for an effective pad area 312, the surface area of the lateral cross-section of the gaps 360 may be less than or equal to about 50 percent of the effective pad area 312. In one or more embodiments, it is possible that for an effective pad area 312, the lateral cross-section of the gaps 360 may be less than or equal to about 45 percent of the effective pad area 312. In one or more embodiments, it is possible that for an effective pad area 312, the lateral cross-section of the gaps 360 may be less than or equal to about 40 percent of the effective pad area 312. In one or more embodiments, it is possible that for an effective pad area 312, the lateral cross-section of the gaps 360 may be less than or equal to about 35 percent of the effective pad area 312. In one or more embodiments, it is possible that for an effective pad area 312, the lateral cross-section of the gaps 360 may be less than or equal to about 30 percent of the effective pad area 312. In one or more embodiments, it is possible that for an effective pad area 312, the lateral cross-section of the gaps 360 may be less than or equal to about 25 percent of the effective pad area 312. In one or more embodiments, it is possible that for an effective pad area 312, the lateral cross-section of the gaps 360 may be less than or equal to about 20 percent of the effective pad area 312. In one or more embodiments, it is possible that for an effective pad area 312, the lateral cross-section of the gaps 360 may be less than or equal to about 15 percent of the effective pad area 312. In one or more embodiments, it is possible that for an effective pad area 312, the lateral cross-section of the gaps 360 may be less than or equal to about 10 percent of the effective pad area 312. In one or more embodiments, it is possible that for an effective pad area 312, the lateral cross-section of the gaps 360 may be less than or equal to about 50 percent of the effective pad area 312 and about greater then or equal to about 10 percent of the effective pad area 312.

Figure 19:
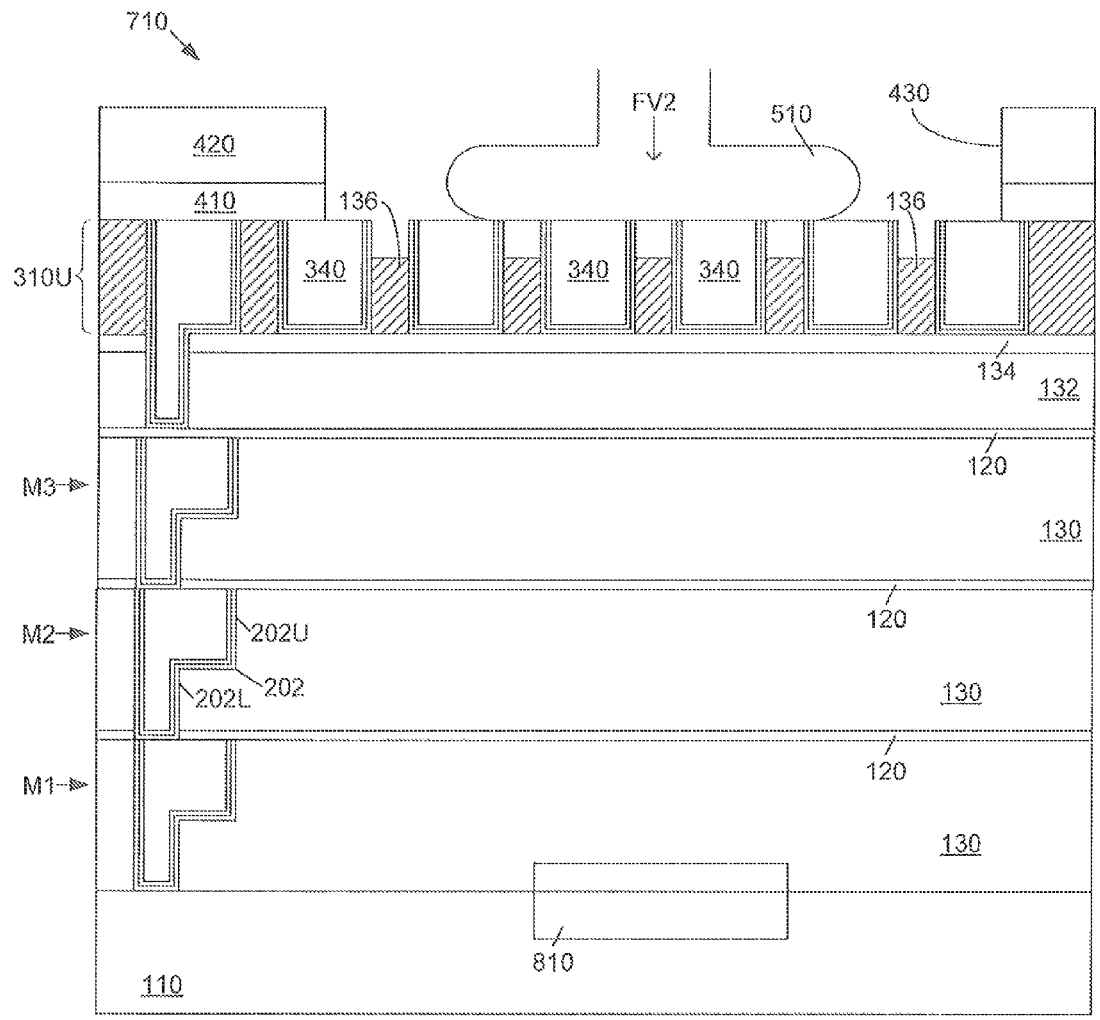
FIG. 19 shows a semiconductor structure in accordance with an embodiment.

Referring to FIG. 19, shows a structure 710 (e.g. a semiconductor structure). The semiconductor structure 710 may, for example, be a semiconductor device. The semiconductor structure 710 may, for example, represent at least a portion of a semiconductor chip. The structure 710 repeats the structure form. FIG. 17A but also shows a substrate 110 (for example, a semiconductor substrate) as well as a first metallization level M1, a second metallizatin level M2, a third metallization level M3. The conductive pad 310U may be part of a final metallization level MF.

Still referring to FIG. 19, the structure 710 further includes an electronic device 810. The electronic device 810 may be formed within and/or over the substrate 110. In one or more embodiments, at least a portion of the electronic device 810 may be formed within the substrate 110. An electronic device may be a semiconductor device. An electronic device may, for example, be an active or passive device. In one or more embodiments, the electronic device 810 may underlie the opening 430. In one or more embodiments, the electronic device may underlie the effective pad area 312 of the conductive pad 310U. In one or more embodiments, the electronic device 810 may be formed under the conductive pad 310U.

One or more embodiments may be a semiconductor structure, comprising: a conductive pad, the conductive pad including a plurality of laterally spaced apart gaps disposed at least partially through the conductive pad.

One or more embodiments may be a semiconductor structure, comprising: a final metallization level including a conductive line, the conductive line including a plurality of laterally spaced apart gaps diposed at least partially through the conductive line.

One or more embodiments relate to a method of making a semiconductor structure, comprising: forming a dielectric layer; patterning the dielectric layer so as to form a plurality of laterally spaced apart dielectric regions, the dielectric regions defining an opening therebetween; forming a conductive layer within the opening; and removing a least a portion of each of the dielectric regions to form a cavity in at least an upper portion of each of the dielectric regions.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

What is claimed is:
1. A semiconductor structure, comprising:
a semiconductor substrate; and a continuous conductive pad disposed over said semiconductor substrate, said conductive pad including a plurality of laterally spaced apart gaps disposed at least partially through said conductive pad.

2. The structure of claim 1, wherein said gaps are disposed substantially fully through said conductive pad.

3. The structure of claim 1, wherein at least a lower portion of each of said gaps is filled with a dielectric material.

4. The structure of claim 3, wherein said dielectric material is an oxide.

5. The structure of claim 1, wherein an upper portion of each of said gaps is a cavity.

6. The structure of claim 1, wherein substantially all of each of said gaps is a cavity.

7. The structure of claim 3, wherein substantially all of each of said gaps is filled with said dielectric material.

8. The structure of claim 1, wherein said plurality of gaps are arranged in a first direction and in a second direction.

9. The structure of claim 8, wherein said first direction is substantially perpendicular to said second direction.

10. The structure of claim 1, wherein gaps have a rectangular lateral cross-section.

11. The structure of claim 1, wherein said conductive pad is part of a final metallization level of said semiconductor structure.

12. The structure of claim 8, wherein said gaps are staggered in said first direction and staggered in said second direction.

13. The structure of claim 1, further comprising an electronic device underlying an effective pad area of said conductive pad.

14. A semiconductor structure, comprising:
a semiconductor substrate;
a final metallization level disposed over said semiconductor substrate, said final metallization level including a continuous conductive line, said conductive line including a plurality of laterally spaced apart gaps disposed at least partially through said conductive line; and
a dielectric layer disposed over said final metallization level, said dielectric layer including an opening, said opening disposed over said gaps.

15. The structure of claim 14, wherein said gaps are disposed substantially fully through said conductive line.

16. The structure of claim 14, wherein at least a lower portion of each of said gaps is filled with a dielectric material.

17. The structure of claim 16, wherein said dielectric material is an oxide.

18. The structure of claim 14, wherein an upper portion of each of said gaps is a cavity.

19. The structure of claim 14, wherein substantially all of each of said gaps is a cavity.

20. The structure of claim 15, wherein substantially all of each of said gaps is filled with said dielectric material.

21. The structure of claim 14, wherein said plurality of gaps are arranged in a first direction and in a second direction.

22. The structure of claim 21, wherein said first direction is substantially perpendicular to said second direction.

23. The structure of claim 14, wherein gaps have a rectangular lateral cross-section.

24. The structure of claim 14, wherein at least a portion of said conductive line is a conductive pad.

25. The structure of claim 14, wherein said semicondutor structure includes an electronic device underlying an effective pad area of said conductive pad.

* * * * *